United States Patent
Oh et al.

(10) Patent No.: US 12,132,037 B2
(45) Date of Patent: Oct. 29, 2024

(54) DISPLAY APPARATUS

(71) Applicant: SAMSUNG ELECTRONICS CO., LTD., Suwon-si (KR)

(72) Inventors: Jongsu Oh, Suwon-si (KR); Sangyoung Park, Suwon-si (KR); Hoseop Lee, Suwon-si (KR); Tetsuya Shigeta, Suwon-si (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/672,090

(22) Filed: Feb. 15, 2022

(65) Prior Publication Data
US 2022/0223576 A1    Jul. 14, 2022

Related U.S. Application Data

(63) Continuation of application No. PCT/KR2021/019955, filed on Dec. 27, 2021.

(30) Foreign Application Priority Data

Jan. 12, 2021   (KR) .......................... 10-2021-0004062

(51) Int. Cl.
| | |
|---|---|
| H01L 25/16 | (2023.01) |
| G09G 3/32 | (2016.01) |
| G09G 3/3233 | (2016.01) |
| H01L 25/075 | (2006.01) |
| H01L 33/62 | (2010.01) |

(52) U.S. Cl.
CPC ............. *H01L 25/167* (2013.01); *G09G 3/32* (2013.01); *G09G 3/3233* (2013.01);
(Continued)

(58) Field of Classification Search
CPC . H01L 25/0753; H01L 25/162; H01L 25/167; H01L 33/62; G09G 3/32;
(Continued)

(56) References Cited

U.S. PATENT DOCUMENTS

| | | |
|---|---|---|
| 8,896,505 B2 | 11/2014 | Cok et al. |
| 10,546,796 B2 | 1/2020 | Hu et al. |

(Continued)

FOREIGN PATENT DOCUMENTS

| | | |
|---|---|---|
| CN | 110391261 A | 10/2019 |
| JP | 2020-052404 A | 4/2020 |

(Continued)

OTHER PUBLICATIONS

Machine Translation of KR-101971979 (Year: 2019).*

(Continued)

*Primary Examiner* — Jason M Mandeville
(74) *Attorney, Agent, or Firm* — Sughrue Mion, PLLC

(57) ABSTRACT

A display apparatus is provided having a plurality of pixels, which are arranged in M columns and N rows and arranged with a constant row space therebetween. The display apparatus includes a plurality of display modules and a housing configured to support the plurality of display modules. Each of the plurality of display modules includes a plurality of pixel packages each including some pixels of the plurality of pixels, and a plurality of micro pixel controllers each controlling the pixels included in each of the plurality of pixel packages. Each of the micro pixel controllers is disposed in the row space between the plurality of pixels to be long in a horizontal direction that is a row direction.

17 Claims, 15 Drawing Sheets

(52) U.S. Cl.
CPC ..... *H01L 25/162* (2013.01); *G09G 2300/026* (2013.01); *G09G 2300/0421* (2013.01); *G09G 2300/0452* (2013.01); *G09G 2300/0804* (2013.01); *G09G 2310/08* (2013.01); *G09G 2320/028* (2013.01); *G09G 2330/12* (2013.01); *H01L 25/0753* (2013.01); *H01L 33/62* (2013.01)

(58) Field of Classification Search
CPC .......... G09G 3/3233; G09G 2300/026; G09G 2300/0421; G09G 2300/0452; G09G 2300/0804; G09G 2310/08; G09G 2320/028; G09G 2330/12
USPC ........................................................ 345/206
See application file for complete search history.

(56) References Cited

U.S. PATENT DOCUMENTS

| | | | |
|---|---|---|---|
| 2010/0207852 A1* | 8/2010 | Cok | H10K 59/129 345/83 |
| 2015/0356918 A1 | 12/2015 | Sakariya et al. | |
| 2017/0256522 A1* | 9/2017 | Cok | H01L 25/50 |
| 2018/0191978 A1 | 7/2018 | Cok et al. | |
| 2018/0323180 A1 | 11/2018 | Cok | |
| 2019/0043844 A1 | 2/2019 | Liu et al. | |
| 2019/0206330 A1 | 7/2019 | Kim et al. | |
| 2020/0020676 A1* | 1/2020 | Cok | H10K 59/90 |

FOREIGN PATENT DOCUMENTS

| | | | | |
|---|---|---|---|---|
| KR | 10-2011-0114718 A | 10/2011 | | |
| KR | 10-2012-0026605 A | 3/2012 | | |
| KR | 10-1153272 B1 | 6/2012 | | |
| KR | 10-1678635 B1 | 11/2016 | | |
| KR | 10-1846789 B1 | 4/2018 | | |
| KR | 101971979 B1 * | 4/2019 | ............... G09G 3/32 |

OTHER PUBLICATIONS

International Search Report issued Apr. 18, 2022 by the International Searching Authority in counterpart International Patent Application No. PCT/KR2021/019955.

* cited by examiner

DISPLAY APPARATUS

CROSS-REFERENCE TO RELATED APPLICATION

This application is a bypass continuation of International Application No. PCT/KR2021/019955, filed on Dec. 27, 2021, which is based on and claims priority to Korean Patent Application No. 10-2021-0004062, filed on Jan. 12, 2021 in the Korean Intellectual Property Office, the disclosure of which is incorporated herein by reference.

BACKGROUND

1. Field

Embodiments of the disclosure relate to a display apparatus that implements an image using an inorganic light-emitting element.

2. Description of the Related Art

A display apparatus may be classified into a self-emitting display in which each pixel emits light by itself and a passive light-emitting display that requires a separate light source.

A liquid crystal display (LCD) is a typical passive light-emitting display, and requires a backlight unit configured to supply light from the rear of a display panel, a liquid crystal layer configured to serve as a switch to transmit/block light, a color filter configured to change supplied light to a desired color, and the like. Thus, the LCD is complex in structure and has a limitation in realizing a small thickness.

On the other hand, in the self-emitting display in which each pixel emits light by itself by including a light-emitting element for each pixel, components such as a backlight unit and a liquid crystal layer are not required and a color filter can also be omitted. Accordingly, the self-emitting display is structurally simple and thus has a high degree of freedom in design. In addition, the self-emitting display may not only have a small thickness, but also an excellent contrast ratio, brightness, and viewing angle.

Among self-emitting displays, a micro light-emitting diode (LED) display is one of flat panel displays and is composed of a plurality of LEDs each having a size of about 100 micrometers. In comparison with the LCD that requires a backlight, the micro-LED display may provide better contrast, response time, and energy efficiency.

Further, the micro-LED, which is an inorganic light-emitting element, has higher brightness, better luminous efficiency, and a longer lifespan in comparison with an organic light-emitting diode (OLED), which requires a separate encapsulation layer for protecting organic materials.

SUMMARY

When a micro pixel controller, in which a pixel circuit is embedded, is used, a viewing angle may be limited due to a difference in height between the micro pixel controller and an inorganic light-emitting element. Therefore, according to an aspect of the disclosure, there is provided a display apparatus having an improved structure so that a viewing angle limitation due to a difference in height between a micro pixel controller and an inorganic light-emitting element does not occur.

According to an example embodiment, there is provided a display apparatus including a plurality of pixels, which are arranged in M columns and N rows (where M>N) and arranged with a constant row space therebetween, the display apparatus including: a plurality of display modules; and a housing configured to support the plurality of display modules, wherein each of the plurality of display modules includes: a plurality of pixel packages, a pixel package of the plurality of pixel packages including at least one pixel of the plurality of pixels; and a plurality of micro pixel controllers, a micro pixel controller of the plurality of micro pixel controller configured to control the at least one pixel, wherein each of the plurality of micro pixel controllers is provided in the row space between the plurality of pixels, and wherein each of the plurality of one micro pixel controllers is configured to be long in a row direction of the display apparatus.

Each of the plurality of pixels is a minimum quadrangular region in which a plurality of colors are expressed by combining at least three inorganic light-emitting elements that emit light of different colors.

The at least three inorganic light-emitting elements are provided in a vertical direction.

Each of the plurality of pixels is a quadrangular region formed by an upper boundary line of an inorganic light-emitting element located at an uppermost portion of the at least three inorganic light-emitting elements, a lower boundary line of an inorganic light-emitting element located at a lowermost portion of the at least three inorganic light-emitting elements, a left boundary line at a leftmost portion of the at least three inorganic light-emitting elements, and right boundary line at a rightmost portion of the at least three inorganic light-emitting elements.

The at least three inorganic light-emitting elements include a red inorganic light-emitting element, a green inorganic light-emitting element, and a blue inorganic light-emitting element.

Each of the plurality of micro pixel controllers has a vertical length that is less than the row space between the plurality of pixels.

The micro pixel controller includes a plurality of pixel circuits configured to independently control a plurality of inorganic light-emitting elements included in the at least one pixel.

Each of the plurality of display modules includes a module substrate, and
  the plurality of pixel package are mounted on a front surface of the module substrate.

The pixel packages includes a package substrate, and
  a plurality of inorganic light-emitting elements forming the at least one pixel.

Each of the plurality of inorganic light-emitting elements includes a light-emitting structure and a pair of element electrodes provided on a rear surface of the light-emitting structure, and the package substrate includes a pair of package front electrode pads formed on the front surface of the package substrate to be respectively and electrically connected to the pair of element electrodes.

The micro pixel controller is mounted on the front surface of the package substrate.

The micro pixel controller includes a connection pin, and the package substrate includes a package front connection pad formed on the front surface of the package substrate to be electrically connected to the connection pin of the at least one micro pixel controller.

The plurality of micro pixel controllers are mounted on the front surface of the module substrate.

Each of the plurality of display modules further includes a driver integrated circuit (IC) configured to transmit a driving signal to the plurality of micro pixel controllers.

The display apparatus may further include a driving board configured to transmit at least one of image data and a timing control signal to the plurality of display modules.

According to another aspect of the disclosure, there is provided a display apparatus including a plurality of pixels, which are arranged in M columns and N rows (where M>N) and arranged with a constant row space therebetween, the display apparatus including: a plurality of display modules; and a housing configured to support the plurality of display modules, wherein each of the plurality of display modules includes: a plurality of pixel groups, each of the plurality of pixel groups including at least one pixel from among the plurality of pixels; and at least one micro pixel controller configured to control the at least one pixel included in each of the plurality of pixel groups, wherein each of the plurality of pixels is a minimum quadrangular region in which a plurality of colors are expressed by combining at least three inorganic light-emitting elements that emit light of different colors, wherein the at least three inorganic light-emitting elements are provided in a vertical direction, and wherein each of the at least one micro pixel controller is provided in the row space between the plurality of pixels, and wherein the at least one micro pixel controller is configured to be long in a row direction of the display apparatus.

Each of the plurality of pixels is a quadrangular region formed by an upper boundary line of an inorganic light-emitting element located at an uppermost portion of the at least three inorganic light-emitting elements, a lower boundary line of an inorganic light-emitting element located at a lowermost portion of the at least three inorganic light-emitting elements, a left boundary line at a leftmost portion of the at least three inorganic light-emitting elements, and right boundary line at a rightmost portion of the at least three inorganic light-emitting elements.

Each of the at least one micro pixel controller has a vertical length that is less than the row space between the plurality of pixels.

Each of the at least one micro pixel controller includes a plurality of pixel circuits, each of the plurality of pixel circuits being configured to independently control each of a plurality of inorganic light-emitting elements included in the at least one pixel controlled by each of the at least one micro pixel controller.

Each of the plurality of display modules includes a module substrate, and the inorganic light-emitting elements included in each of the plurality of display modules and the at least one micro pixel controller included in each of the plurality of display modules are mounted on a front surface of the module substrate.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
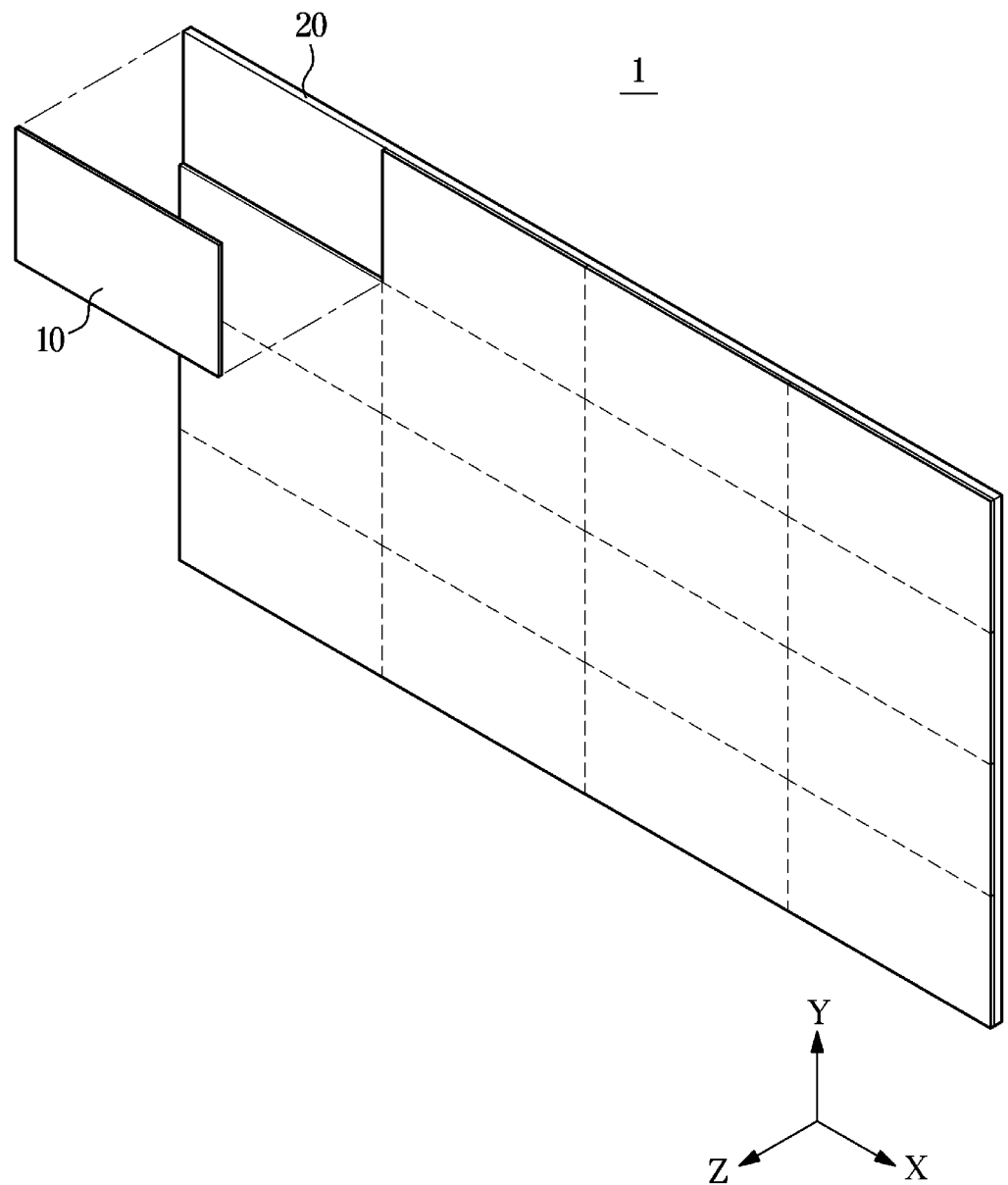
FIG. 1 is a view illustrating an exterior of a display apparatus according to an example embodiment of the disclosure.

Since embodiments disclosed in the specification are merely preferable examples of the disclosure and do not represent the entire technical concept of the present disclosure, it should be understood that various equivalents or modifications capable of replacing the embodiments and made at the time of filing the present application are included in the scope of the disclosure.

A singular expression used in the description may include a plural expression unless otherwise stated in the context. In the drawings, the shape, size, and the like of elements may be exaggerated for clarity of description.

In the specification, it is to be understood that the terms such as "including," "having," and the like are intended to indicate the presence of the features, numbers, steps, actions, components, parts, or combinations thereof disclosed in the present specification, and are not intended to preclude the possibility of the presence or addition of one or more other features, numbers, steps, actions, components, parts, or combinations thereof.

Throughout the specification, the expression of ordinal numbers such as "first," and "second," is used to distinguish a plurality of components from each other, but the ordinal numbers used are not intended to indicate an arrangement order, a manufacturing order, a degree of importance, or the like between the components.

The singular forms include plural forms unless otherwise clarified in the context.

Hereinafter, exemplary embodiments of the disclosure will be described in detail with reference to the accompanying drawings.

Figure 2:
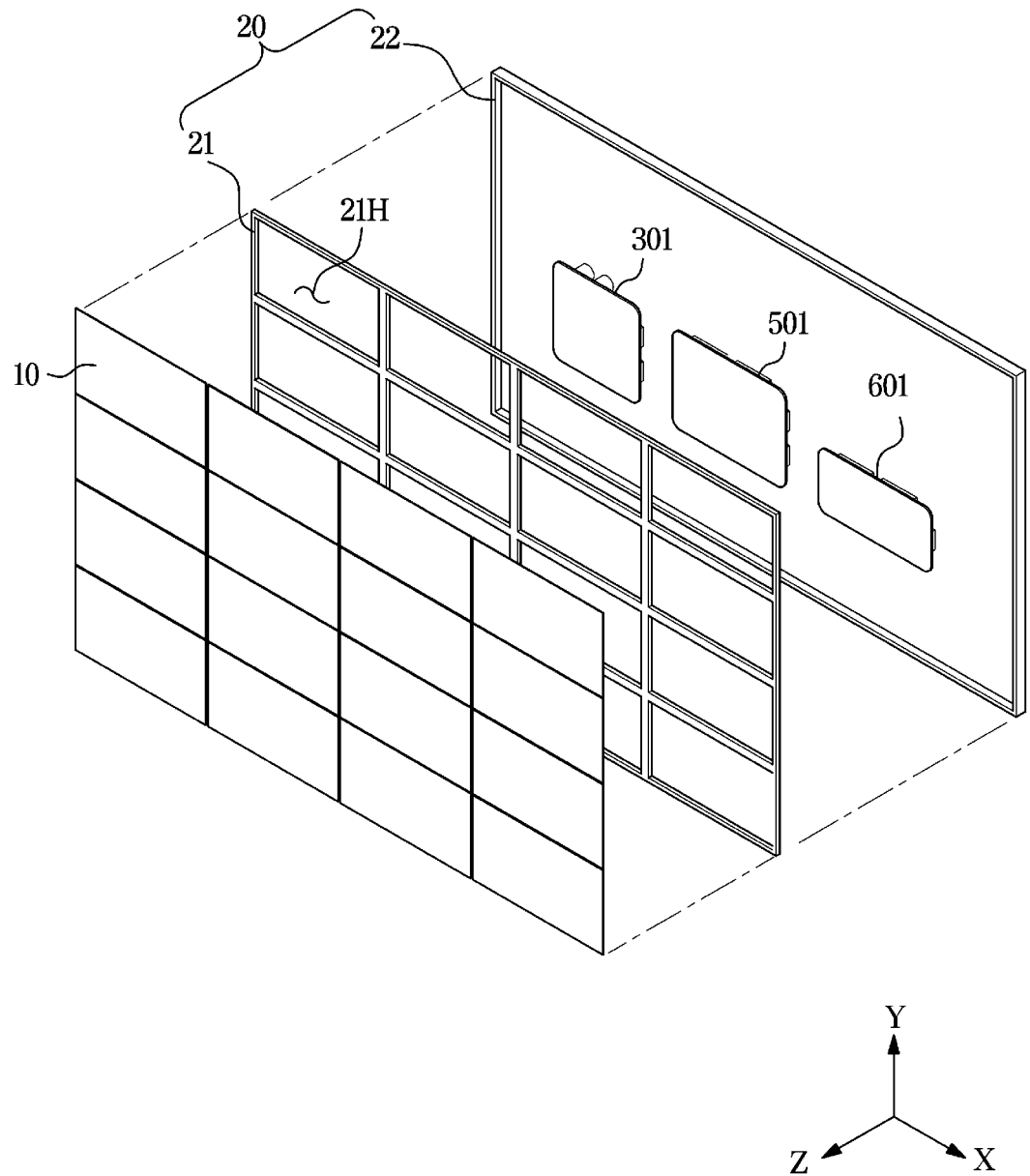
FIG. 2 is an exploded view of components of the display apparatus according to an example embodiment of the disclosure.

FIG. 1 is a view illustrating an exterior of a display apparatus according to an example embodiment of the disclosure. FIG. 2 is an exploded view of components of the display apparatus according to an example embodiment of the disclosure.

A three-dimensional coordinate system of XYZ axes shown in FIG. 1 is based on a display apparatus 1, a plane on which a screen of the display apparatus 1 is located is an XY plane, and a direction in which an image is output or an inorganic light-emitting element emits light is a +Z direction.

Hereinafter, an +X direction and an −X direction are referred to as leftward and rightward directions, respectively, a +Y direction and a −Y direction are referred to as upward and downward directions, respectively, and the +Z direction and a −Z direction are referred to as forward and backward directions, respectively.

Further, the +X direction and the −X direction may be referred to as a horizontal direction or a column direction, and the +Y direction and the −Y direction may be referred to as a vertical direction or a row direction.

Referring to FIGS. 1 and 2, the display apparatus 1 is a self-emitting display apparatus in which a light-emitting element is disposed for each pixel so that each pixel may emit light by itself. Accordingly, unlike a liquid crystal display (LCD) apparatus, since a component such as a backlight unit, a liquid crystal layer, or the like is not required, it is possible to realize a small thickness, and various design changes are possible due to the simple structure.

Further, the display apparatus 1 may employ an inorganic light-emitting element, such as an inorganic light-emitting diode (LED), as the light-emitting element provided in each pixel. The inorganic light-emitting element has a faster response speed and may realize high luminance with low power compared to an organic light-emitting element such as an organic light-emitting diode (OLED).

In addition, in comparison with the organic light-emitting element that requires an encapsulation process because the organic light-emitting element is vulnerable to exposure to moisture and oxygen and has poor durability, the inorganic light-emitting element may not require the encapsulation process and may have better durability. Hereinafter, the inorganic light-emitting element mentioned in the embodiment to be described below may mean an inorganic LED.

The inorganic light-emitting element employed in the display apparatus 1 may be a micro-LED having a short side length of about 100 μm. As described above, by employing the micro-scale LED, a pixel size may be reduced and a higher resolution may be realized within the same size screen.

Further, when an LED chip is manufactured in a micro-scale size, it is possible to solve a problem in which the LED chip is broken due to characteristics of inorganic materials upon being bent. That is, when the micro-LED chip is transferred to a flexible substrate, the LED chip is not broken even when the substrate is bent, so that a flexible display apparatus may also be implemented.

As shown in FIG. 1, the display apparatus 1 may include a plurality of display modules 10 including a plurality of inorganic light-emitting elements, and a housing 20 configured to support the plurality of display modules 10. As described above, it is possible to implement a large-area screen by tiling the plurality of display modules 10 and fixing the display modules 10 to the housing 20, and the display apparatus 1 of the large-area screen may be used as a television (TV), signage, an electric billboard, or the like. However, the example embodiment of the display apparatus 1 is not limited thereto. As an example, the display apparatus 1 may be formed of a single display module 10. In addition, the display apparatus 1 may also be used as a wearable device, a portable device, or a monitor for a personal computer (PC).

The plurality of display modules 10 may be arranged in the form of a two-dimensional matrix and fixed to the housing 20. The plurality of display modules 10 may be installed in a frame 21, and the frame 21 may have a two-dimensional mesh structure having an open partial region corresponding to the plurality of display modules 10.

Specifically, as many openings 21H as the number of the display modules 10 may be formed in the frame 21, and the openings 21H may have the same arrangement as the plurality of display modules 10.

An edge part of each of the plurality of display modules 10 may be mounted on the frame 21. The edge part may be a region in which a circuit element or line is not formed.

The plurality of display modules 10 may be mounted on the frame 21 through a method of using the magnetic force of a magnet, coupling by a mechanical structure, bonding by an adhesive, or the like. However, the disclosure is not limited thereto, and as such, other methods in which the plurality of display modules 10 are mounted on the frame 21 may be provided according to other example embodiments.

The display apparatus 1 may further include a driving board 501 configured to transmit at least one of image data and a timing control signal to the plurality of display modules. A timing controller 500 (see FIG. 4) may be provided on the driving board 501.

The display apparatus 1 may further include a main board 310 on which a main controller 300 (see FIG. 4) is provided. The display apparatus 1 may further include a power board 601 configured to supply power to the plurality of display modules 10.

The driving board 501, the main board 301, and the power board 601 may be provided on the rear of the frame 21, and may be electrically connected to each of the plurality of display modules 10 through the openings 21H formed in the frame 21.

A rear cover 22 is coupled to the rear of the frame 21, and the rear cover 22 may form a rear exterior of the display apparatus 1.

Figure 3:
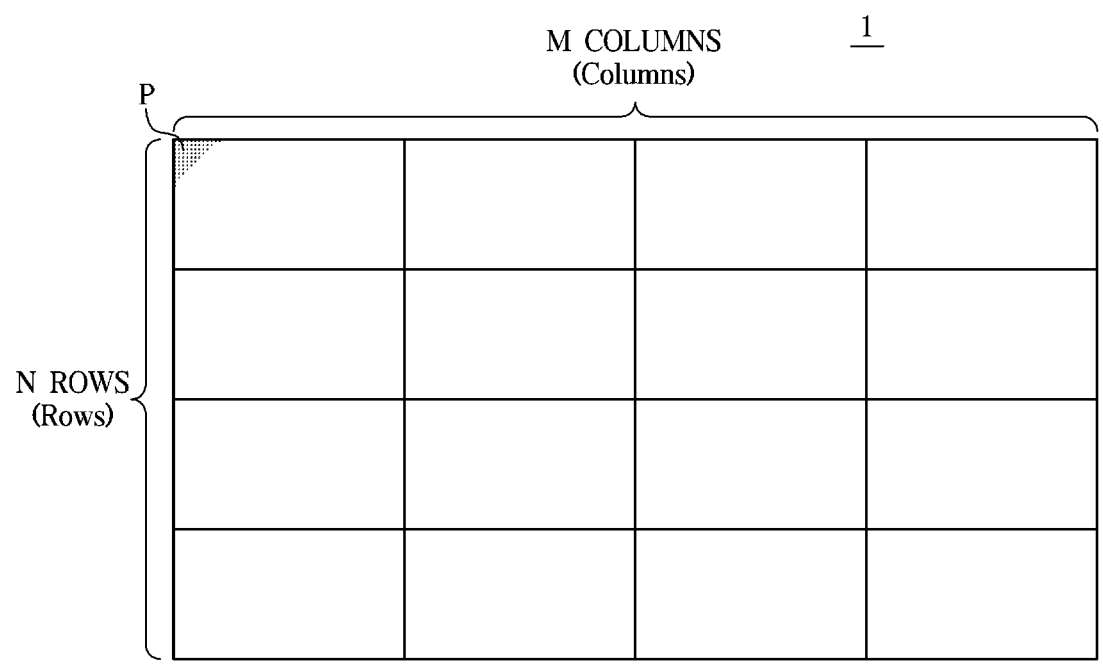
FIG. 3 is a view illustrating an example of a pixel array of the display apparatus according to an example embodiment of the disclosure.

FIG. 3 is a view illustrating an example of a pixel array of the display apparatus according to an example embodiment of the disclosure.

Referring to FIG. 3, the display apparatus 1 may include a plurality of pixels P arranged two dimensionally. Here, when it is described that the plurality of pixels P are arranged two dimensionally, this may include a case in which the plurality of pixels P are arranged on the same plane as well as a case in which the plurality of pixels P are arranged on different planes parallel to each other. The plurality of pixels P may be arranged in M columns and N rows (where M>N). Thus, the display apparatus 1 may include a total of M×N pixels P.

Pixel pitches PP of the plurality of pixels P in the horizontal and vertical directions may be constant. Here, the pixel pitch PP may represent a distance from a center of one pixel P to a center of adjacent pixel P in the horizontal or vertical direction.

As described above, since the plurality of pixels P are arranged in M columns and N rows (where M>N), and the pixel pitches PP of the plurality of pixels P in the horizontal and vertical directions are constant, a length of the display apparatus 1 in the horizontal direction may be greater than a length of the display apparatus 1 in the vertical direction.

Figure 8:
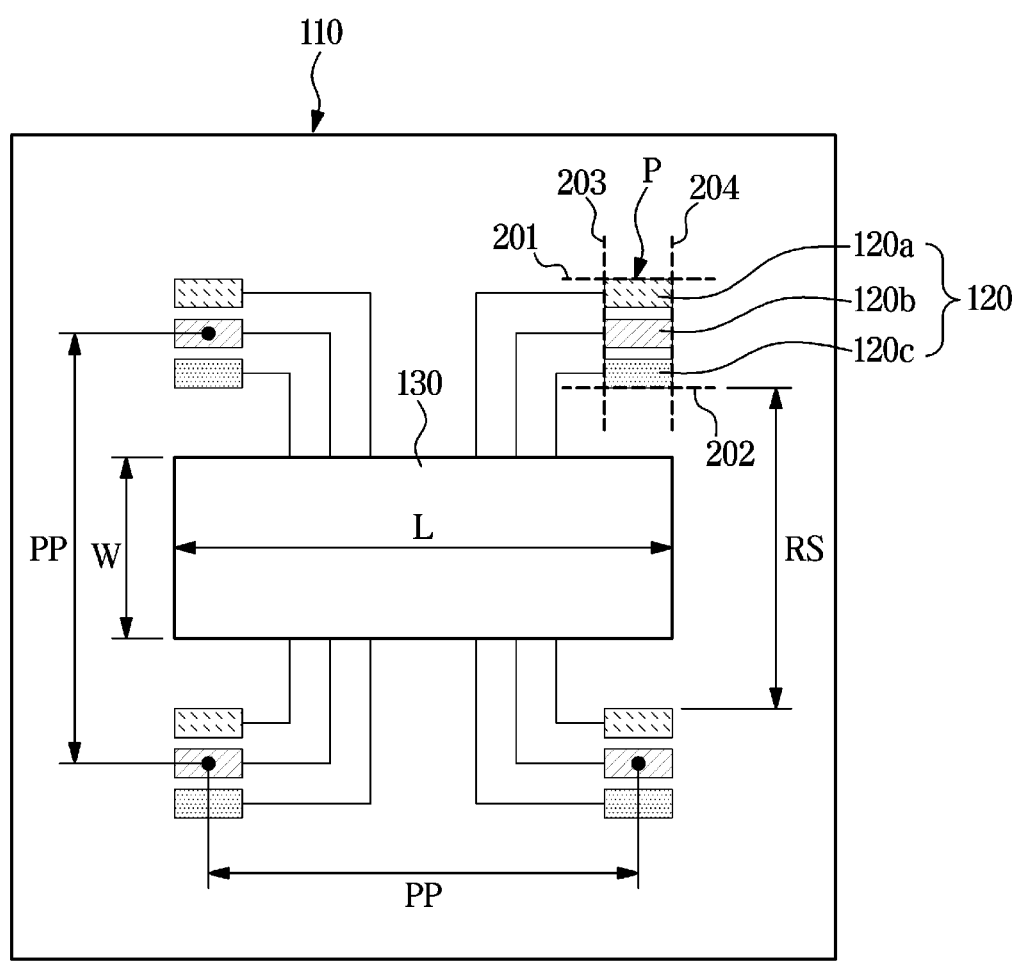
FIG. 8 is an enlarged view of the arrangement structure of the micro pixel controller of FIG. 7.

The pixel P may be defined as a minimum quadrangular region in which various colors may be expressed by combining a plurality of sub-pixels emitting light of different colors (see FIG. 8).

For example, the pixel P may be defined as a minimum quadrangular region in which various colors may be expressed by combining at least three sub-pixels outputting light of different colors. Specifically, the pixel P may be composed of three sub-pixels respectively corresponding to red (R), green (G), and blue (B). Here, a red sub-pixel may output red light, a green sub-pixel may output green light, and a blue sub-pixel may output blue light.

However, the pixel P is not necessarily composed of the red sub-pixel configured to output red light, the green sub-pixel configured to output green light, and the blue sub-pixel configured to output blue light, and may include a sub-pixel configured to output yellow light or white light according to another example embodiment.

According to an example embodiment, the sub-pixel may include an inorganic light-emitting element. For example, the red sub-pixel may include an R-inorganic light-emitting element, the green sub-pixel may include a G-inorganic light-emitting element, and the blue sub-pixel may include a B-inorganic light-emitting element.

As described above, since the display apparatus 1 is formed by tiling the plurality of display modules 10, the pixels P included in each of the display modules 10 may constitute some of the pixels P of the display apparatus 1.

Figure 4:
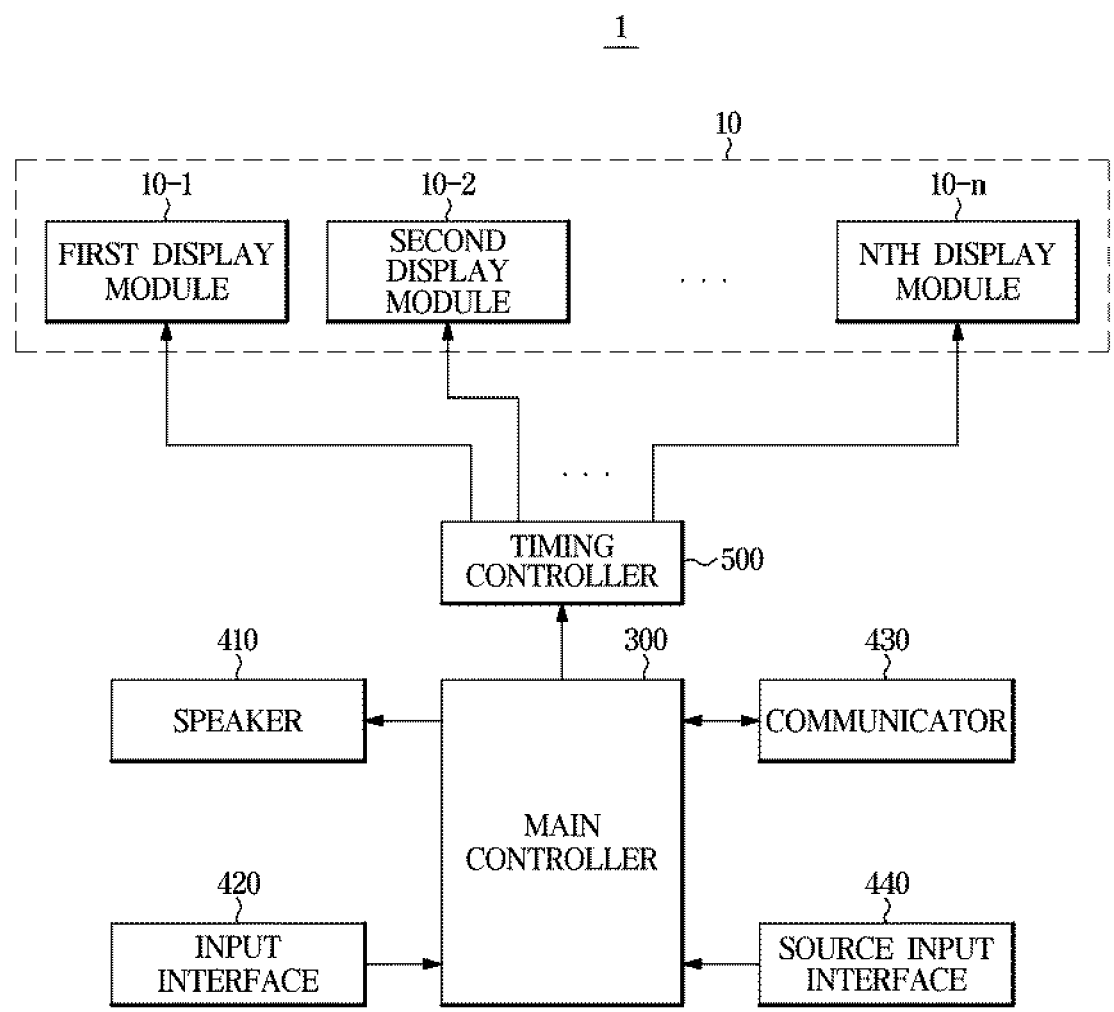
FIG. 4 is a control block diagram of the display apparatus according to an example embodiment of the disclosure.

FIG. 4 is a control block diagram of the display apparatus according to an example embodiment of the disclosure.

The display apparatus 1 includes a plurality of display modules 10-1, 10-2, . . . , and 10-n (where n is an integer greater than or equal to two). The display apparatus 1 may include the main controller 300 and the timing controller 500 configured to control the plurality of display modules 10, a communicator 430 configured to communicate with an external device, a source input interface 440 configured to receive a source image, a speaker 410 configured to output a sound, and an input interface 420 configured to receive a command for controlling the display apparatus 1 from a user.

The input interface 420 may include a button or a touch pad provided in one region of the display apparatus 1, and, when a display panel 11 (see FIG. 5) is implemented as a touch screen, the input interface 420 may include a touch pad provided on a front surface of the display panel 11. In addition, the input interface 420 may also include a remote controller.

The input interface 420 may receive various commands for controlling the display apparatus 1, such as power on/off, volume adjustment, channel adjustment, screen adjustment, various setting changes, or the like of the display apparatus 1, from the user.

The speaker 410 may be provided in one region of the housing 20, and a separate speaker module physically separated from the housing 20 may be further provided.

The communicator 430 may transmit and receive necessary data by performing communication with a relay server or other electronic devices. The communicator 430 may employ at least one of various wireless communication methods, such as 3rd Generation (3G), 4th Generation (4G), wireless LAN, Wi-Fi, Bluetooth, Zigbee, Wi-Fi Direct (WFD), ultra-wide band (UWB), infrared data association (IrDA), Bluetooth low energy (BLE), near field communication (NFC), and Z-wave. In addition, the communicator 430 may also employ a wired communication method such as peripheral component interconnect (PCI), PCI-express, or universal serial bus (USB).

The source input interface 440 may receive a source signal input from a set-top box, a USB, an antenna, and the like. Accordingly, the source input interface 440 may include at least one selected from a source input interface group including a high definition multimedia interface (HDMI) cable port, a USB port, an antenna, and the like.

The source signal received by the source input interface 440 may be processed by the main controller 300 to be converted into a form that may be output by the display panel 11 and the speaker 410.

The main controller 300 and the timing controller 500 may include at least one memory, which is configured to store programs for performing operations to be described below and various types of data, and at least one processor configured to execute the stored programs.

The main controller 300 may process the source signal input through the source input interface 440 to generate an image signal corresponding to the input source signal.

For example, the main controller 300 may include a source decoder, a scaler, an image enhancer, and a graphics processor. The source decoder may decode a source signal compressed in a format such as a Motion Picture Experts Group (MPEG) format, and the scaler may output image data of a desired resolution through resolution conversion.

The image enhancer may improve the image quality of the image data by applying various correction techniques. The graphics processor may classify pixel of the image data into RGB data and output a control signal such as a syncing signal for display timing in the display panel 11. That is, the main controller 300 may output a control signal and image data corresponding to the source signal.

The above-described operation of the main controller 300 is merely an example applicable to the display apparatus 1, and of course, the main controller 300 may further perform other operations, or some of the operations described above may be omitted.

The image data and the control signal output from the main controller 300 may be transmitted to the timing controller 500.

The timing controller 500 may convert the image data transmitted from the main controller 300 into image data of a format that may be processed in a driver integrated circuit (IC) 200 (see FIG. 5), and generate various control signals such as a timing control signal necessary for displaying the image data on the display panel 11.

Figure 5:
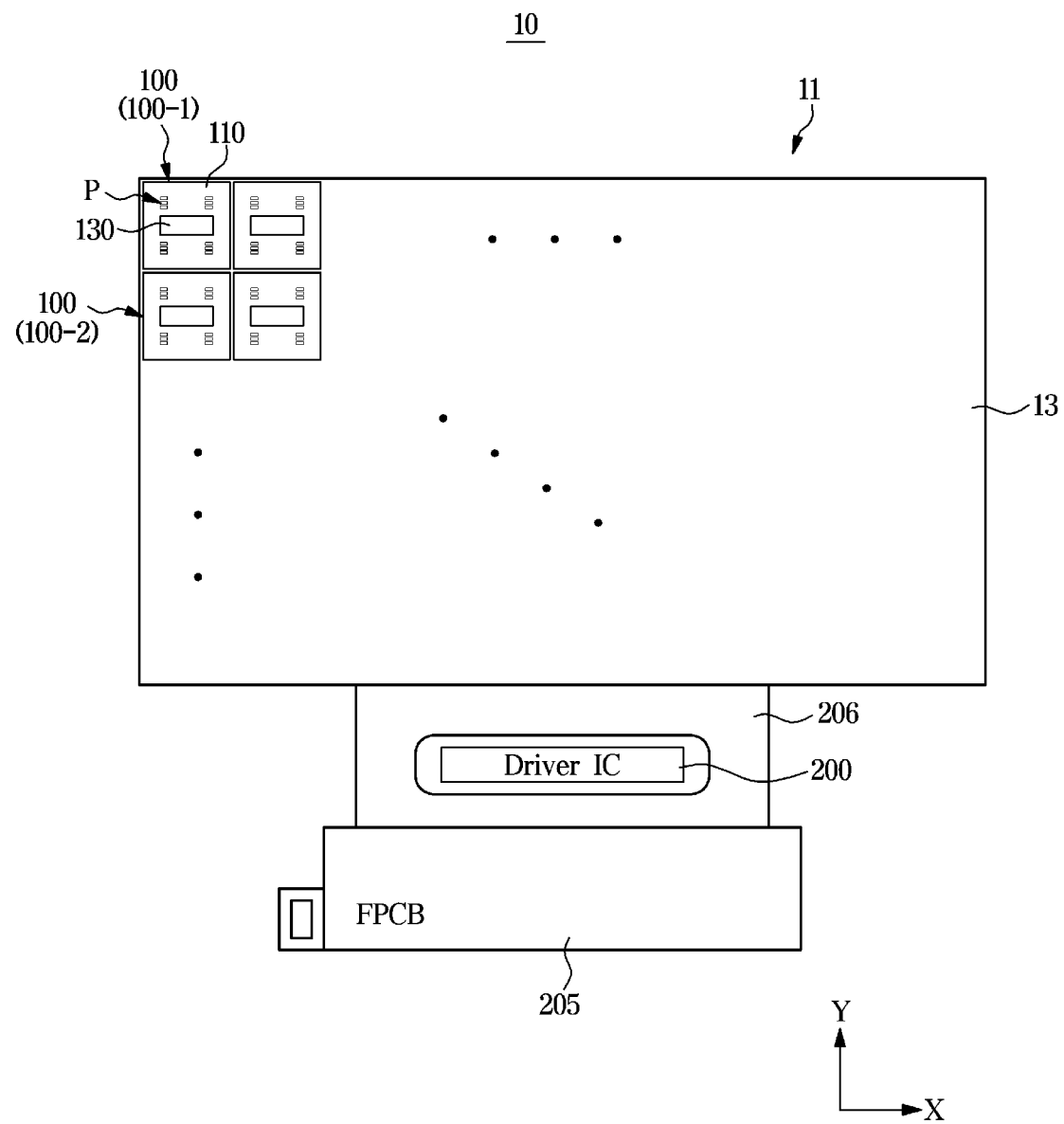
FIG. 5 is a view illustrating a display module according to an example embodiment of the disclosure.
Figure 6:
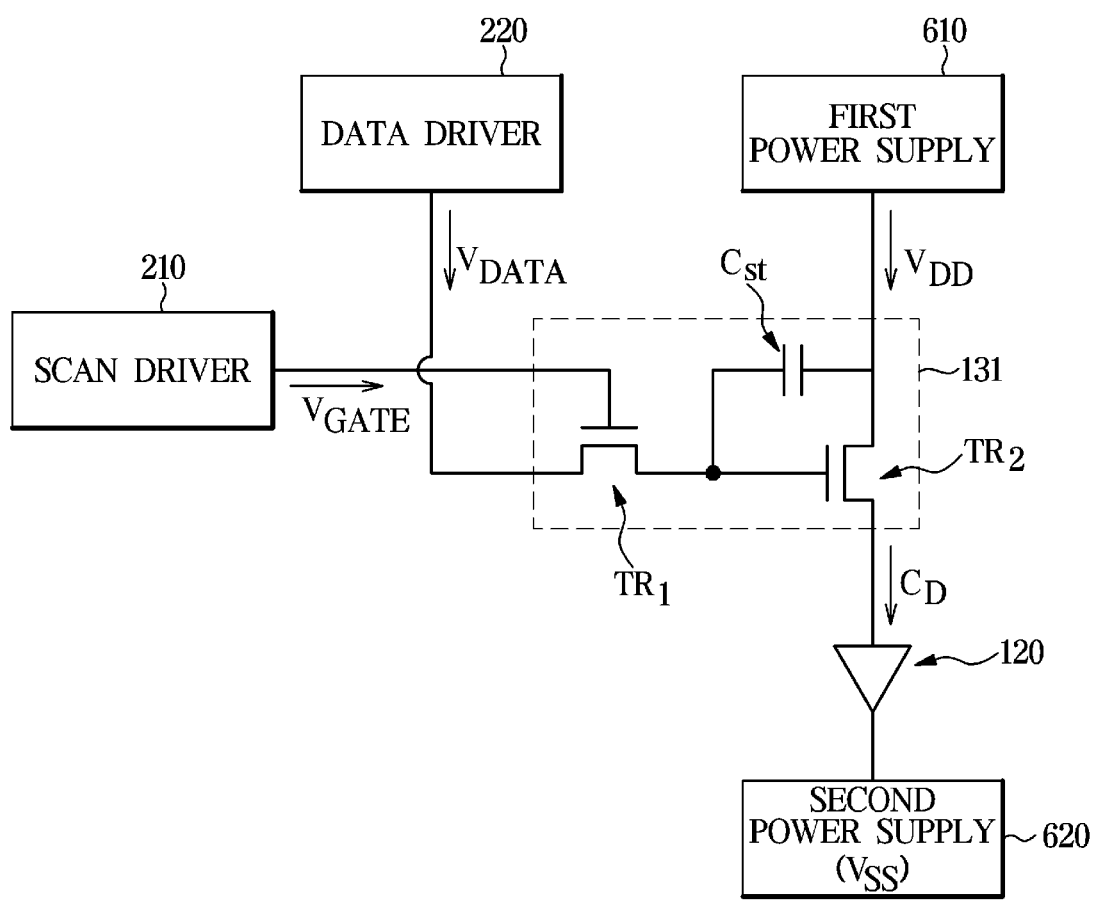
FIG. 6 is a circuit diagram schematically illustrating a pixel circuit configured to control a single sub-pixel according to an example embodiment of the disclosure.

FIG. 5 is a view illustrating the display module according to an example embodiment of the disclosure. FIG. 6 is a circuit diagram schematically illustrating a pixel circuit configured to control a single sub-pixel according to an example embodiment of the disclosure.

Referring to FIGS. 5 and 6, the display module 10 may include the display panel 11 configured to display an image and the driver IC 200 configured to drive the display panel 11.

The driver IC 200 may generate a driving signal based on the image data and the timing control signal transmitted from the timing controller 500 so that the display panel 11 may display an image. The driver IC 200 may be mounted on a film 206 to which a flexible printed circuit board (FPCB) 205 is connected. That is, one end of the film 206 on which the driver IC 200 is mounted may be connected to a module substrate 13, and the other end thereof may be electrically connected to the FPCB 205. The FPCB 205 may be electrically connected to the driving board 501, the power board 601, and the like.

The driving signal generated by the driver IC 200 may include at least one of a gate signal and a data signal, and the generated driving signal is input to the display panel 11.

The display panel 11 may include a plurality of pixel packages 100. Each of the pixel packages 100 may include pixels P. The pixels P included in the pixel package 100 may constitute some of the plurality of pixels P of the display module 10 including the pixel package 100. In addition, the pixels P included in the pixel package 100 may constitute some of the plurality of pixels P of the display apparatus 1.

The pixel package 100 may include a micro pixel controller 130 configured to control the pixels P included in the pixel package 100. Here, controlling the pixels P may mean controlling inorganic light-emitting elements 120, each of which is a sub-pixel constituting the pixel P. That is, the micro pixel controller 130 may control the inorganic light-emitting elements 120 that are sub-pixels included in the pixel package 100.

Each of the inorganic light-emitting elements 120 may be driven by an active matrix (AM) method or a passive matrix (PM) method, but in the example embodiment to be described below, for detailed description, a case in which the inorganic light-emitting element 120 is driven by the AM method will be described as an example.

The micro pixel controller 130 may individually control each of the inorganic light-emitting elements 120. The micro pixel controller 130 may operate based on the driving signal output from the driver IC 200.

The driver IC 200 may include a scan driver 210 and a data driver 220. The scan driver 210 may output the gate signal for turning the inorganic light-emitting element 120, which is the sub-pixel, on/off, and the data driver 220 may output the data signal for implementing an image.

However, according to various example embodiments, some of the operations of the driver IC 200 may be performed by the micro pixel controller 130. For example, the operation of the scan driver 210 may be performed by the micro pixel controller 130, and in this case, the driver IC 200 may not include the scan driver 210. In the example embodiment to be described below, for detailed description, the case in which the driver IC 200 includes both the scan driver 210 and the data driver 220 will be described as an example.

The scan driver 210 may generate the gate signal based on the timing control signal transmitted from the timing controller 500, and the data driver 220 may generate the data signal based on the image data transmitted from the timing controller 500.

The micro pixel controller 130 may include a pixel circuit 131 for individually controlling each inorganic light-emitting element 120, and the gate signal output from the scan driver 210 and the data signal output from the data driver 220 may be input to the pixel circuit 131.

For example, when a gate voltage $V_{GATE}$, a data voltage $V_{DATA}$, and a power supply voltage $V_{DD}$ are input to the pixel circuit 131, the pixel circuit 131 may output a driving current $C_D$ for driving the inorganic light-emitting element 120.

The driving current $C_D$ output from the pixel circuit 131 may be input to the inorganic light-emitting element 120, and the inorganic light-emitting element 120 may emit light due to the input driving current $C_D$ to implement an image.

The pixel circuit 131 may include thin-film transistors $TR_1$ and $TR_2$ configured to switch or drive the inorganic light-emitting element 120 and a capacitor $C_{st}$.

For example, the thin-film transistors $TR_1$ and $TR_2$ may include a switching transistor $TR_1$ and a driving transistor $TR_2$, and the switching transistor $TR_1$ and the driving transistor $TR_2$ may be implemented as P-type metal oxide semiconductor (PMOS) type transistors. However, the example embodiment of the display module 10 and the display apparatus 1 is not limited thereto, and the switching transistor $TR_1$ and the driving transistor $TR_2$ may be implemented as N-type metal oxide semiconductor (NMOS) type transistors.

The switching transistor $TR_1$ has a gate electrode connected to the scan driver 210, a source electrode connected to the data driver 220, and a drain electrode connected to one end of the capacitor $C_{st}$ and a gate electrode of the driving transistor $TR_2$. The other end of the capacitor $C_{st}$ may be connected to a first power supply 610.

In addition, the driving transistor $TR_2$ has a source electrode connected to the first power supply 610 configured to supply the power supply voltage $V_{DD}$ and a drain electrode connected to an anode of the inorganic light-emitting element 120. A cathode of the inorganic light-emitting element 120 may be connected to a second power supply 620 configured to supply a reference voltage $V_{SS}$. The reference voltage $V_{SS}$ may be a voltage lower than the power supply voltage $V_{DD}$, and a ground voltage or the like may be used as the reference voltage $V_{SS}$ to provide the ground.

The pixel circuit 131 of the above-described structure may operate as described below. First, when the gate voltage $V_{GATE}$ is applied from the scan driver 210 to turn the switching transistor $TR_1$ on, the data voltage $V_{DATA}$ applied from the data driver 220 may be transmitted to one end of the capacitor $C_{st}$ and the gate electrode of the driving transistor $TR_2$.

A voltage corresponding to a gate-source voltage $V_{GS}$ of the driving transistor $TR_2$ may be maintained for a predetermined time due to the capacitor $C_{st}$. The driving transistor $TR_2$ may apply the driving current $C_D$ corresponding to the gate-source voltage $V_{GS}$ to the anode of the inorganic light-emitting element 120, thereby causing the inorganic light-emitting element 120 to emit light.

However, the above-described structure of the pixel circuit 131 is merely an example applicable to the display module 10 according to an example embodiment, and various circuit structures for switching and driving the plurality of inorganic light-emitting elements 120 may be applied to the display module 10 in addition to the above example.

Figure 7:
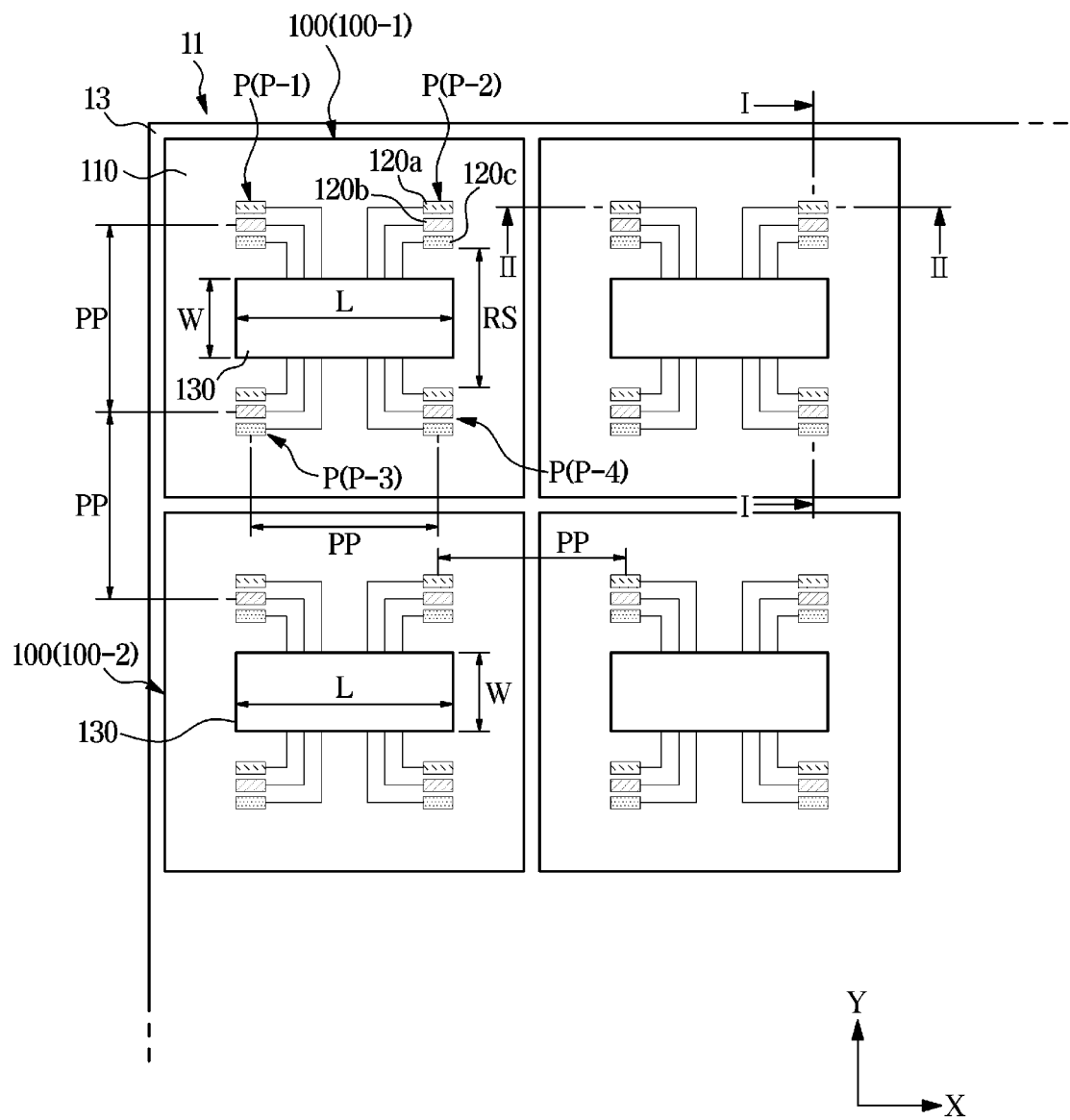
FIG. 7 is a view illustrating an arrangement structure of a micro pixel controller according to an example embodiment of the disclosure.
Figure 9:
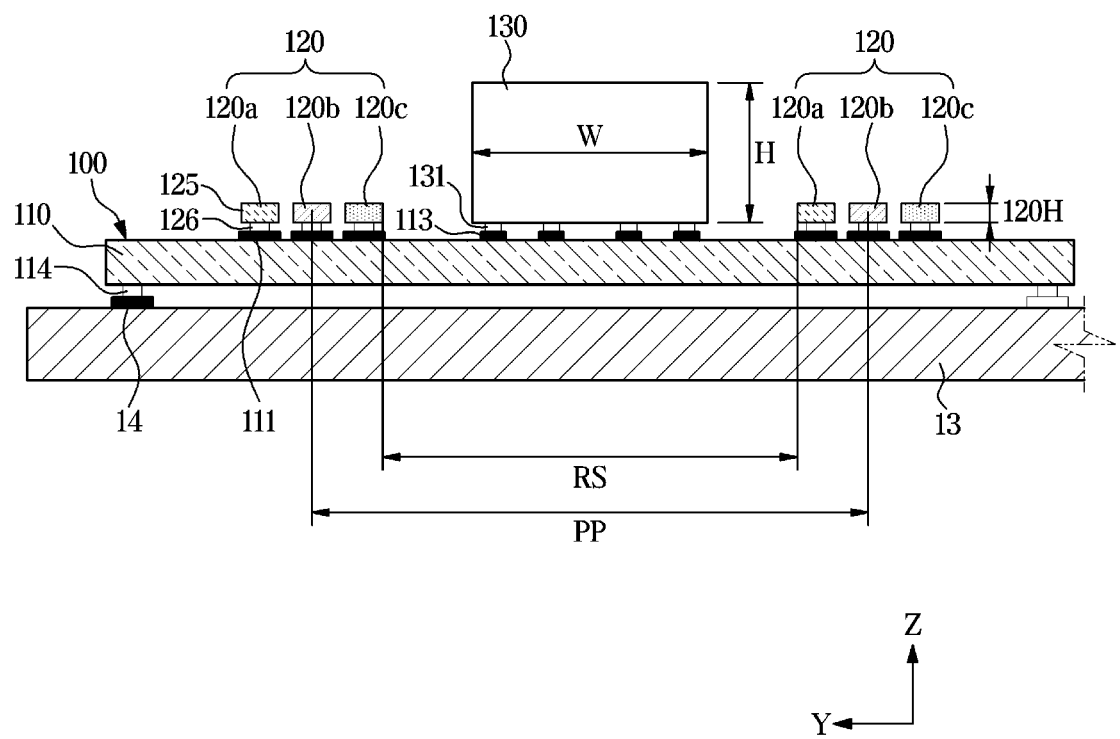
FIG. 9 is a cross-sectional view taken along line I-I of FIG. 7.
Figure 10:
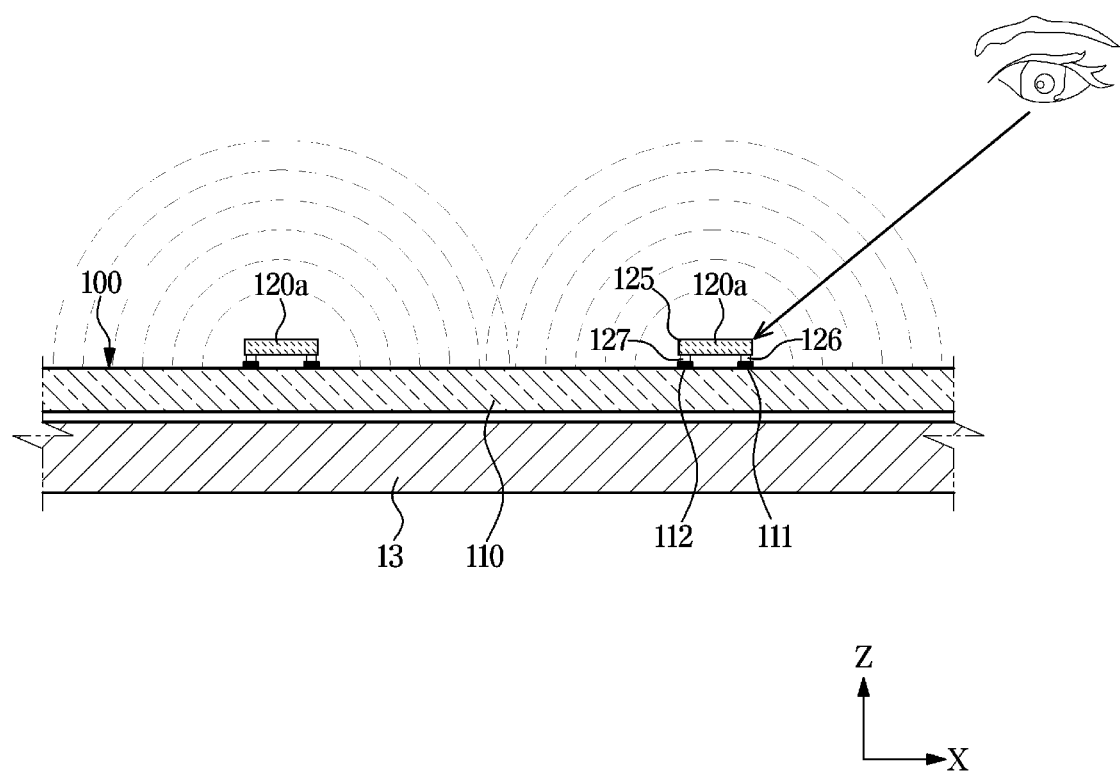
FIG. 10 is a cross-sectional view taken along line II-II of FIG. 7.

FIG. 7 is a view illustrating an arrangement structure of a micro pixel controller according to an example embodiment of the disclosure. FIG. 8 is an enlarged view of the arrangement structure of the micro pixel controller of FIG. 7. FIG. 9 is a cross-sectional view taken along line I-I of FIG. 7. FIG. 10 is a cross-sectional view taken along line II-II of FIG. 7.

Reference will now be made to FIGS. 7 to 10.

A display panel 11 may include a module substrate 13 and a plurality of pixel packages 100 mounted on a front surface of the module substrate 13. The plurality of pixel packages 100 may be arranged two dimensionally on the front surface of the module substrate 13.

Each of the pixel packages 100 may include a package substrate 110, a plurality of inorganic light-emitting elements 120 mounted on a front surface of the package substrate 110, and a micro pixel controller 130 mounted on the front surface of the package substrate 110 to control the plurality of inorganic light-emitting elements 120. The plurality of inorganic light-emitting elements 120 may form a pixel P. According to an example embodiment, the pixel package 100 may have four pixels P-1, P-2, P-3, and P-4, and for this, the pixel package 100 may include twelve inorganic light-emitting elements 120.

As described above, according to an example embodiment, the pixel P may be defined as a minimum quadrangular region in which various colors may be expressed by combining at least three inorganic light-emitting elements 120 emitting light of different colors. According to an example embodiment, the at least three inorganic light-emitting elements 120a, 120b, and 120c may include an R-inorganic light-emitting element, a G-inorganic light-emitting element, and a B-inorganic light-emitting element.

The three inorganic light-emitting elements 120a, 120b, and 120c may be formed to have the same shape and size, and arranged in a vertical direction. Since the three inorganic light-emitting elements 120a, 120b, and 120c forming one pixel P are disposed in the vertical direction, changes in color, brightness, contrast, or the like of the pixel P according to changes in left and right angles of viewing the display apparatus 1 may be reduced.

When the three inorganic light-emitting elements 120a, 120b, and 120c forming one pixel P are disposed in the vertical direction as described above, the pixel P may be specifically defined as a quadrangular region formed by an upper boundary line 201 of the inorganic light-emitting element 120a located at the uppermost portion of the three inorganic light-emitting elements 120a, 120b, and 120c, a lower boundary line 202 of the inorganic light-emitting element 120c located at the lowermost portion of the three inorganic light-emitting elements 120a, 120b, and 120c, a left boundary line 203 located at the leftmost portion of the three inorganic light-emitting elements 120a, 120b, and 120c, and a right boundary line 204 located at the rightmost portion of the inorganic light-emitting elements 120a, 120b, and 120c.

According to an example embodiment, the pixels P may be arranged with a constant row space RS therebetween.

As described above, a pixel pitch PP of the pixels P represents a distance from a center of one pixel P to a center of adjacent pixel P. Not only the pixel pitch PP between the pixels P belonging to one pixel package 100, but also the pixel pitch PP between the pixels P belonging to different pixel packages 100-1 and 100-2 have a constant value.

The row space RS between the pixels P represents a distance between the pixels P in the vertical direction. Since the center of the pixel P and the boundary line of the pixel P are spaced apart by a predetermined length, the pixel pitch PP of the pixels P and the row space RS between the pixels P are different from each other. Specifically, the row space RS between the pixels P has a smaller value than the pixel pitch PP.

According to an example embodiment, the three inorganic light-emitting elements 120a, 120b, and 120c forming one pixel P are provided in the vertical direction, and thus, the row space RS between the pixels P may mean, for example, a distance between a lower boundary line of the inorganic light-emitting element located at the lowermost portion of the plurality of inorganic light-emitting elements belonging to one pixel P and an upper boundary line of the inorganic light-emitting element located at the uppermost portion of the plurality of inorganic light-emitting elements belonging to adjacent pixel P provided below the one pixel P.

According to an example embodiment, a height H of the micro pixel controller 130 may be formed to be greater than a height 120H of the inorganic light-emitting element 120. A viewing angle of the display apparatus 1 may be limited by the difference in height between the micro pixel controller 130 and the inorganic light-emitting element 120.

In particular, when a screen of the display apparatus 1 is formed to be long in the horizontal direction, that is, in the case of the display apparatus 1 in which the pixels are arranged in M columns and N rows and M>N as in the example embodiment, a viewing angle in the horizontal direction may be problematic.

In order to prevent the viewing angle of the display apparatus 1 in the horizontal direction from being limited by the difference in height between the micro pixel controller 130 and the inorganic light-emitting element 120, in the example embodiment, the micro pixel controller 130 may be provided in the row space RS between the plurality of pixels P.

As described above, since the micro pixel controller 130 is provided in the row space RS between the plurality of pixels P, the viewing angle of the display apparatus 1 in the horizontal direction may not be limited regardless of the height of the micro pixel controller 130.

The micro pixel controller 130 may have a horizontal length L and a vertical length W, and the vertical length W of the micro pixel controller 130 may be provided to be less than the row space RS between the plurality of pixels P so that the micro pixel controller 130 is provided in the row space RS between the plurality of pixels P.

The inorganic light-emitting element 120 may include a light-emitting structure 125 including a growth substrate, an N-type semiconductor layer, an active layer, and the like, and a pair of element electrodes 126 and 127 formed on a rear surface of the light-emitting structure 125. The N-type semiconductor layer, the active layer, and a P-type semiconductor layer may be made of a nitride semiconductor, and the active layer may serve as a light-emitting layer that emits light by as much as a band gap energy generated by recombination of electrons and holes.

A pair of package front electrode pads 111 and 112 may be formed on the front surface of the package substrate 110 to be respectively and electrically connected to the pair of element electrodes 126 and 127 of the inorganic light-emitting element 120.

The micro pixel controller 130 may include a connection pin 131, and a package front connection pad 113 may be formed on the front surface of the package substrate 110 to be electrically connected to the connection pin 131 of the micro pixel controller 130.

A package rear connection pad 114 may be formed on a rear surface of the package substrate 110, and a module front connection pad 14 may be formed on the front surface of the module substrate 13 to be electrically connected to the package rear connection pad 114.

As described above, it is not necessary to form circuit elements such as a thin-film transistor (TFT) for switching the inorganic light-emitting element 120 other than the electrode pad or lines on the module substrate 13. Thus, since other restrictions such as TFT performance do not have to be considered in selecting the type of module substrate 13, the module substrate 13 may be implemented as a glass substrate having excellent durability against the heat of the inorganic light-emitting element 120.

Further, since the circuit elements such as a TFT are not provided on the module substrate 13, the circuit elements may be prevented from being damaged in a cutting process of the module substrate 13 and a line formation process, or a replacement process of the inorganic light-emitting element 120, and the difficulty of a manufacturing process of the display module 10 may be reduced.

Figure 11:
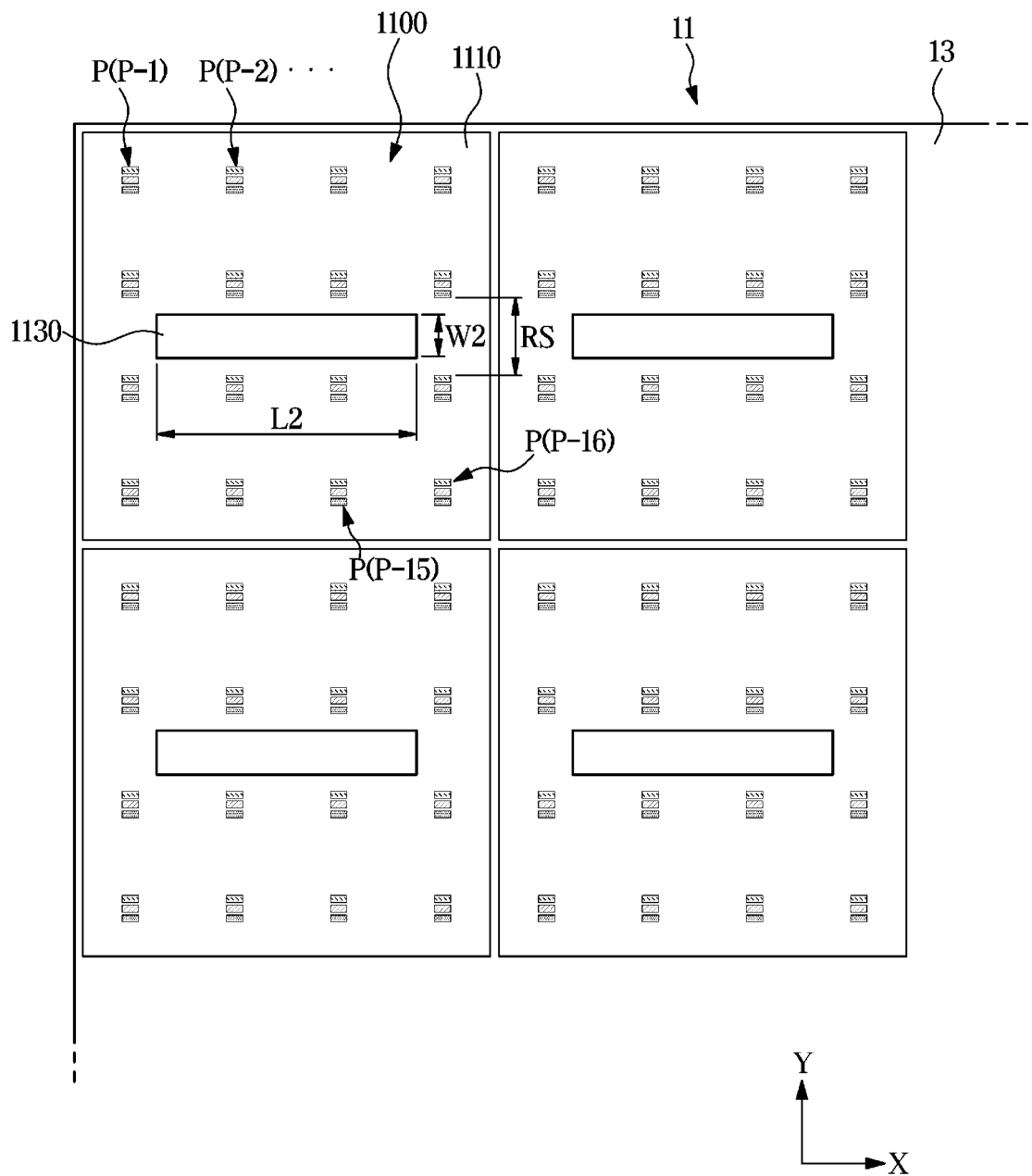
FIG. 11 is a view illustrating an arrangement structure of a micro pixel controller according to another example embodiment of the disclosure.

FIG. 11 is a view illustrating an arrangement structure of a micro pixel controller according to another example embodiment of the disclosure.

The above-described pixel package 100 includes four pixels P, but the number of the pixels P included in the pixel package 100 is not limited.

That is, as shown in FIG. 11, a pixel package 1100 may include sixteen pixels P-1, P-2, . . . , and P-16, and for this, the pixel package 1100 may include 48 inorganic light-emitting elements 120. The pixel package 1100 may include a package substrate 1110, inorganic light-emitting elements 120 mounted on a front surface of the package substrate 1110, and a micro pixel controller 1130 mounted on the front surface of the package substrate 1110 to control the inorganic light-emitting elements 120.

Regardless of the number of the pixels P included in the pixel package 1100, the micro pixel controller 1130 may be provided in a row space RS between the pixels P to avoid left and right viewing angle limitations.

In this case, the number of the inorganic light-emitting elements 120 controlled by the micro pixel controller 1130 may increase, and thus, a physical size of the micro pixel controller 1130 may be increased. However, since the micro pixel controller 1130 should be provided in the row space RS between the pixels P as described above, a vertical length W2 of the micro pixel controller 1130 should still be limited to be within the row space RS between the pixels P.

However, a horizontal length L2 of the micro pixel controller 1130 may be extended. Accordingly, the horizontal length L2 of the micro pixel controller 1130 of FIG. 11 may be formed to greater than the horizontal length L of the micro pixel controller 130 of FIG. 7.

Figure 12:
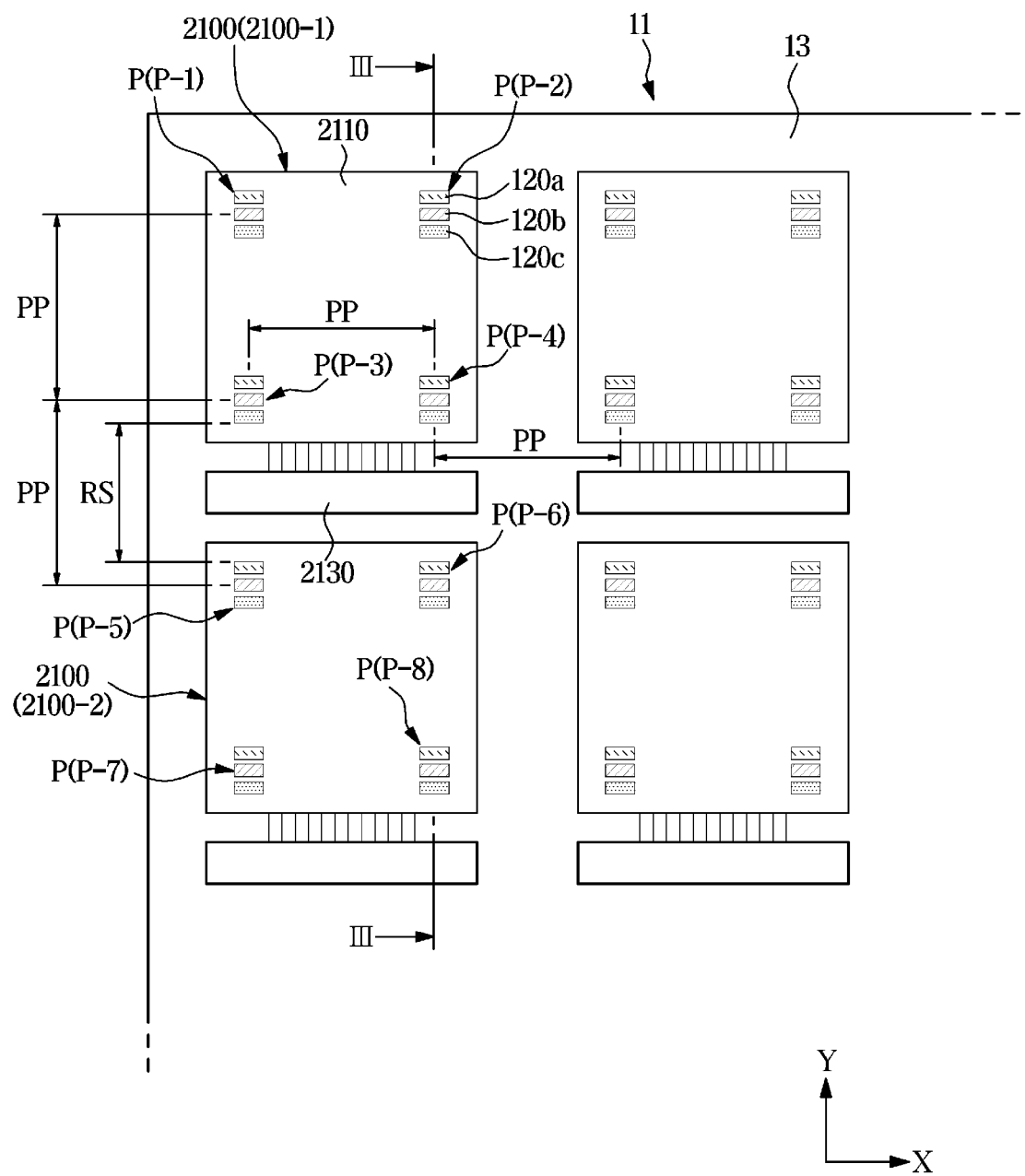
FIG. 12 is a view illustrating an arrangement structure of a micro pixel controller according to still another example embodiment of the disclosure.
Figure 13:
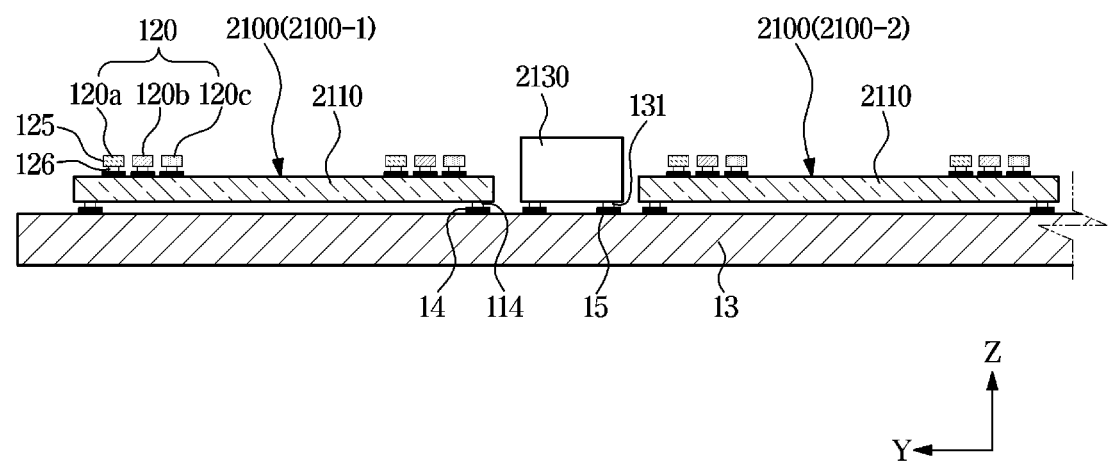
FIG. 13 is a cross-sectional view taken along line III-III of FIG. 12.

FIG. 12 is a view illustrating an arrangement structure of a micro pixel controller according to still another example embodiment of the disclosure. FIG. 13 is a cross-sectional view taken along line III-III of FIG. 12.

For the same components as those of the above-described example embodiments, reference numerals and descriptions may be omitted.

The example embodiment illustrated in FIG. 12 may be different from the example embodiments described above, in that, a micro pixel controller 2130 may be provided on a module substrate 13 rather than a package substrate 2110.

A display panel 11 may include the module substrate 13 and a plurality of pixel packages 2100 mounted on a front surface of the module substrate 13. The plurality of pixel packages 2100 may be arranged two dimensionally on the front surface of the module substrate 13. Each of the pixel packages 2100 may include a plurality of pixels P.

As an example, the plurality of pixel packages 2100 may include a first pixel package 2100-1 and a second pixel package 2100-2 provided below the first pixel package 2100-1.

The first pixel package 2100-1 may include four pixels P-1, P-2, P-3, and P-4, and the second pixel package 2100-2 may include four pixels P-5, P-6, P-7, and P-8.

The display panel 11 may include a plurality of micro pixel controllers 2130 that control the plurality of pixel packages 2100. The micro pixel controller 2130 may be provided adjacent to an upper or lower side of the pixel package 2100 controlled by the micro pixel controller 2130.

As an example, as shown in FIG. 12, the micro pixel controller 2130, which controls the pixel package 2100-1, may be provided between the pixel package 2100-1 and the pixel package 2100-2.

Similar in the example embodiments described above, the micro pixel controller 2130 may be disposed in a row space RS of the pixels P to be long in the horizontal direction.

The micro pixel controller 2130 may include a connection pin 131, and a module front connection pad 15 may be formed on the front surface of the module substrate 13 to be electrically connected to the connection pin 131 of the micro pixel controller 2130.

As described above, since the micro pixel controller 2130 is directly mounted on the module substrate 13, a circuit test may be individually performed for each micro pixel controller 2130 before the micro pixel controller 2130 is mounted on the module substrate 13, and only the micro pixel controller 2130 determined as a good product by the circuit test may be mounted on the module substrate 13. Thus, the circuit test may be easily performed and a defective product may be easily replaced.

Figure 14:
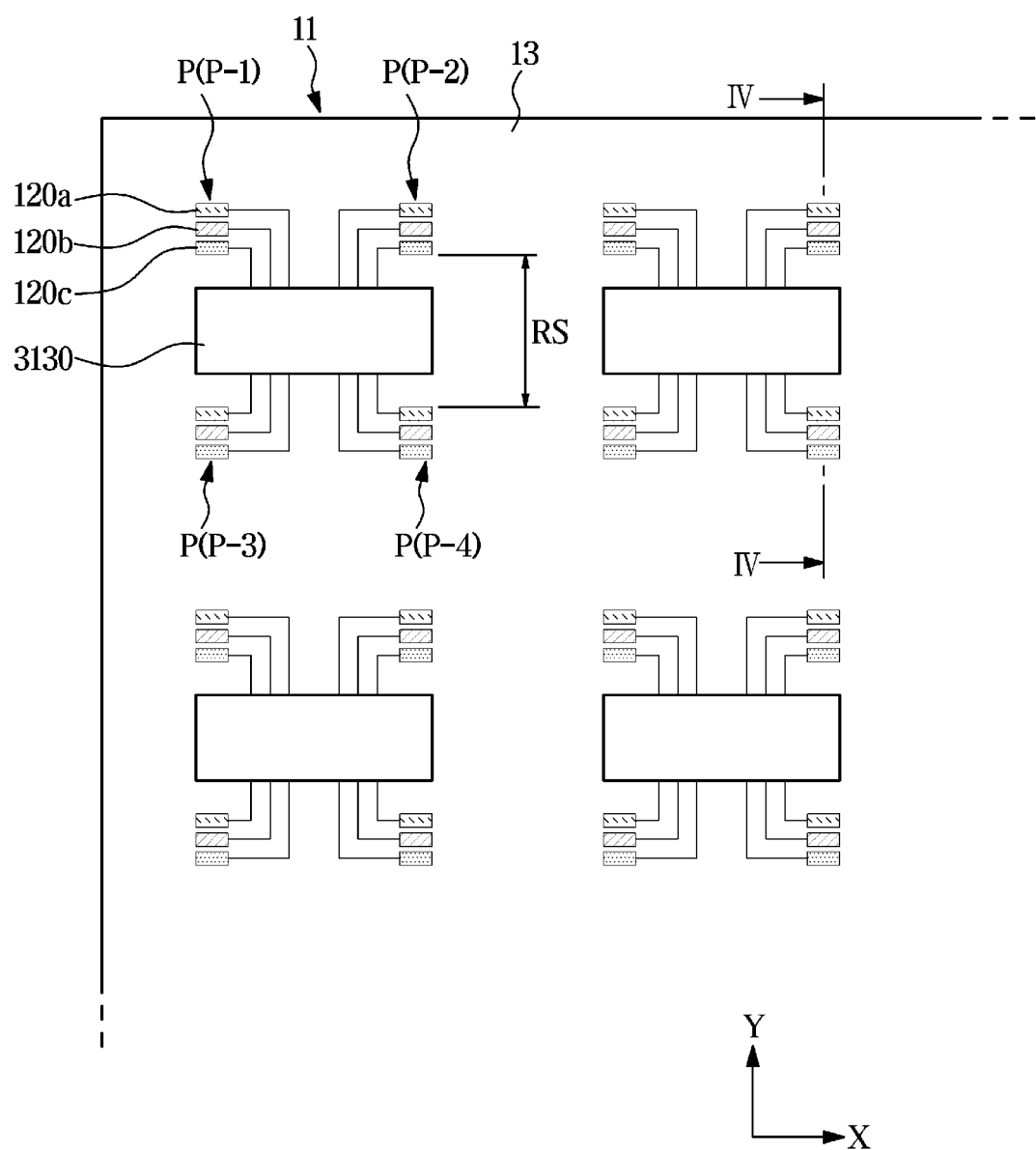
FIG. 14 is a view illustrating an arrangement structure of a micro pixel controller according to yet another example embodiment of the disclosure.
Figure 15:
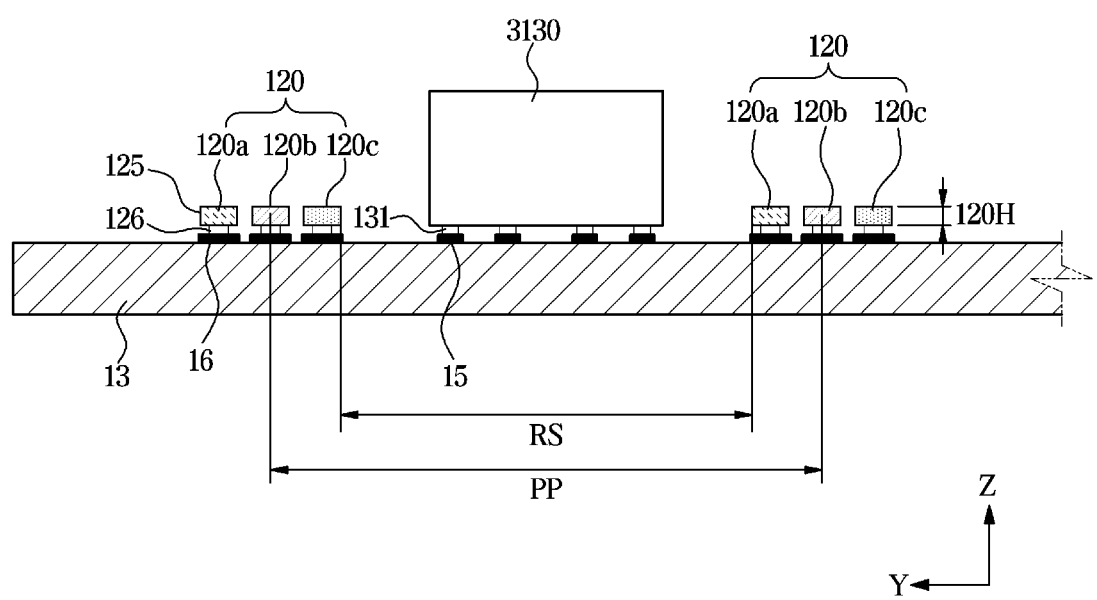
FIG. 15 is a cross-sectional view taken along line IV-IV of FIG. 14.

FIG. 14 is a view illustrating an arrangement structure of a micro pixel controller according to yet another example embodiment of the disclosure. FIG. 15 is a cross-sectional view taken along line IV-IV of FIG. 14.

For the same components as those of the above-described embodiments, reference numerals and descriptions may be omitted.

The example embodiment illustrated in FIG. 12 may be different from the embodiments described above, in that, a plurality of pixels P and a micro pixel controller 3130 may be directly mounted on a module substrate 13 without being packaged.

The micro pixel controller 3130 may control some pixels P-1, P-2, P-3, and P-4 among the plurality of pixels P of the display apparatus 1.

The micro pixel controller 3130 may be provided in a row space RS between the pixels P to be long in the horizontal direction.

A module electrode pad 16, which is electrically connected to element electrodes 126 and 127 of an inorganic light-emitting element 120 may be formed on a front surface of the module substrate 13.

According to example embodiments of the disclosure, it is possible to prevent a viewing angle limitation due to a difference in height between a micro pixel controller, in which a pixel circuit is embedded, and an inorganic light-emitting element from occurring.

Although the technical scope of the disclosure has been described above with reference to the specific example embodiments, the scope of the disclosure is not limited to the example embodiments. It should be appreciated by those skilled in the art that changes may be made in these example embodiments without departing from the principles and spirit of the present disclosure, the scope of which is defined in the claims and their equivalents.

What is claimed is:

1. A display apparatus including a screen with a plurality of pixels, which are arranged in M columns and N rows (where M>N) and arranged with a constant row space therebetween, the screen having a horizontal side extending in a row direction and a vertical side extending in a column direction, with the horizontal side being longer than the vertical side, the display apparatus comprising:
   a plurality of display modules; and
   a housing configured to support the plurality of display modules,
   wherein each of the plurality of display modules includes:
   a plurality of pixel packages, a pixel package of the plurality of pixel packages including at least one pixel of the plurality of pixels; and
   a plurality of micro pixel controllers, a micro pixel controller of the plurality of micro pixel controllers configured to control the at least one pixel,
   wherein each of the plurality of pixels includes at least three inorganic light-emitting elements that emit light of different colors, the at least three inorganic light-emitting elements including a first inorganic light-emitting element emitting light of a first color, a second inorganic light-emitting element emitting light of a second color, and a third inorganic light-emitting element emitting light of a third color, wherein the first color, the second color and the third color are different from each other,
wherein the first inorganic light-emitting element, the second inorganic light-emitting element, and the third inorganic light-emitting element are adjacent to each other in a column direction and linearly arranged in the column direction with respect to each other such that the first inorganic light-emitting element is above the second inorganic light-emitting element, and the second inorganic light-emitting element is above the third inorganic light-emitting element, so that the vertical side of the screen, which is a shorter one among the sides of the screen, is parallel to the direction in which the first inorganic light-emitting element, the second inorganic light-emitting element, and the third inorganic light-emitting element are linearly arranged each other,
wherein each of the plurality of micro pixel controllers is provided in the row space between the plurality of pixels,
wherein each of the plurality of micro pixel controllers is has a first side parallel to the row direction and a second side parallel to the column direction, and the first side is longer than the second side,
wherein each of the plurality of pixels is a quadrangular region formed by an upper boundary line of an inorganic light-emitting element, of the at least three inorganic light-emitting elements, located at an uppermost portion of the at least three inorganic light-emitting elements, a lower boundary line of an inorganic light-emitting element located at a lowermost portion of the at least three inorganic light-emitting elements, a left boundary line at a leftmost portion of the at least three inorganic light-emitting elements, and a right boundary line at a rightmost portion of the at least three inorganic light-emitting elements,
wherein each of the at least three inorganic light-emitting elements comprises a side that aligns with the second side of each of the plurality of micro pixel controllers, and
wherein the first side of each of the plurality of micro pixel controllers is parallel to the horizontal side of the screen while the second side of each of the plurality of micro pixel controllers is parallel to the vertical side of the screen, so that the first side, which is a longer one among the sides of each of the plurality of micro pixel controllers, extends in the row direction in which the horizontal side of the screen, which is a longer one among the sides of the screen, extends.

2. The display apparatus of claim 1, wherein each of the plurality of pixels is a minimum quadrangular region in which a plurality of colors are expressed by combining the at least three inorganic light-emitting elements that emit light of different colors.

3. The display apparatus of claim 1, wherein the at least three inorganic light-emitting elements include a red inorganic light-emitting element, a green inorganic light-emitting element, and a blue inorganic light-emitting element.

4. The display apparatus of claim 1, wherein each of the plurality of micro pixel controllers has a vertical length that is less than the row space between the plurality of pixels.

5. The display apparatus of claim 1, wherein the micro pixel controller includes a plurality of pixel circuits configured to independently control a plurality of inorganic light-emitting elements included in the at least one pixel.

6. The display apparatus of claim 1, wherein
each of the plurality of display modules includes a module substrate, and
the plurality of pixel packages are mounted on a front surface of the module substrate.

7. The display apparatus of claim 6, wherein the plurality of micro pixel controllers are mounted on the front surface of the module substrate.

8. The display apparatus of claim 1, wherein
the pixel package includes a package substrate, and
a plurality of inorganic light-emitting elements forming the at least one pixel are mounted on a front surface of the package substrate.

9. The display apparatus of claim 8, wherein
each of the plurality of inorganic light-emitting elements includes a light-emitting structure and a pair of element electrodes provided on a rear surface of the light-emitting structure, and
the package substrate includes a pair of package front electrode pads formed on the front surface of the package substrate to be respectively and electrically connected to the pair of element electrodes.

10. The display apparatus of claim 8, wherein the micro pixel controller is mounted on the front surface of the package substrate.

11. The display apparatus of claim 10, wherein
the micro pixel controller includes a connection pin, and
the package substrate includes a package front connection pad formed on the front surface of the package substrate to be electrically connected to the connection pin of the micro pixel controller.

12. The display apparatus of claim 1, wherein each of the plurality of display modules further includes a driver integrated circuit (IC) configured to transmit a driving signal to the plurality of micro pixel controllers.

13. The display apparatus of claim 12, further comprising a driving board configured to transmit at least one of image data and a timing control signal to the plurality of display modules.

14. A display apparatus including a screen with a plurality of pixels, which are arranged in M columns and N rows (where M>N) and arranged with a constant row space therebetween, the screen having a horizontal side extending in a horizontal direction and a vertical side extending in a vertical direction, with the horizontal side being longer than the vertical side, the display apparatus comprising:
a plurality of display modules; and
a housing configured to support the plurality of display modules,
wherein each of the plurality of display modules includes:
a plurality of pixel groups, each of the plurality of pixel groups including at least one pixel from among the plurality of pixels; and
at least one micro pixel controller configured to control the at least one pixel included in each of the plurality of pixel groups,
wherein each of the plurality of pixels is a minimum quadrangular region in which a plurality of colors are expressed by combining at least three inorganic light-emitting elements that emit light of different colors,
wherein the at least three inorganic light-emitting elements includes a first inorganic light-emitting element emitting light of a first color, a second inorganic light-emitting element emitting light of a second color, and a third inorganic light-emitting element emitting light of a third color, wherein the first color, the second color and the third color are different from each other, wherein the first inorganic light-emitting element, the second inorganic light-emitting element, and the third inorganic light-emitting element adjacent to each other in a vertical direction and are linearly arranged in the vertical direction, in which a column extends, with respect to each other such that the first inorganic light-emitting element is above the second inorganic light-emitting element, and the second inorganic light-emitting element is above the third inorganic light-emitting element, so that the vertical side of the screen, which is a shorter one among the sides of the screen, is parallel to the direction in which the first inorganic light-emitting element, the second inorganic light-emitting element, and the third inorganic light-emitting element are linearly arranged each other, wherein each of the at least one micro pixel controller is provided in the row space between the plurality of pixels, wherein the at least one micro pixel controller has a first side parallel to the row direction and a second side parallel to the vertical direction, and the first side is longer than the second side wherein each of the plurality of pixels is a quadrangular region formed by an upper boundary line of an inorganic light-emitting element located at an uppermost portion of the at least three inorganic light-emitting elements, a lower boundary line of an inorganic light-emitting element located at a lowermost portion of the at least three inorganic light-emitting elements, a left boundary line at a leftmost portion of the at least three inorganic light-emitting elements, and a right boundary line at a rightmost portion of the at least three inorganic light-emitting elements, wherein each of the at least three inorganic light-emitting elements comprises a side that aligns with the second side of each of the at least one micro pixel controller, and wherein the first side of each of the at least one micro pixel controller is parallel to the horizontal side of the screen while the second side of each of the at least one micro pixel controller is parallel to the vertical side of the screen, so that the first side, which is a longer one among the sides of each of the at least one micro pixel controller, extends in the horizontal direction in which the horizontal side of the screen, which is a longer one among the sides of the screen, extends.

15. The display apparatus of claim 14, wherein each of the at least one micro pixel controller has a vertical length that is less than the row space between the plurality of pixels.

16. The display apparatus of claim 14, wherein each of the at least one micro pixel controller includes a plurality of pixel circuits, each of the plurality of pixel circuits being configured to independently control each of a plurality of inorganic light-emitting elements included in the at least one pixel controlled by each of the at least one micro pixel controller.

17. The display apparatus of claim 14, wherein each of the plurality of display modules includes a module substrate, and the at least three inorganic light-emitting elements included in each of the plurality of display modules and the at least one micro pixel controller included in each of the plurality of display modules are mounted on a front surface of the module substrate.

* * * * *